(12) United States Patent
Morishima et al.

(10) Patent No.: US 8,043,698 B2
(45) Date of Patent: *Oct. 25, 2011

(54) METHOD OF PRODUCING A SEMICONDUCTOR DEVICE, AND WAFER-PROCESSING TAPE

(75) Inventors: Yasumasa Morishima, Tokyo (JP); Kenji Kita, Nisshin (JP); Shinichi Ishiwata, Tokyo (JP); Takanori Yamakawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 909 days.

This patent is subject to a terminal disclaimer.

(21) Appl. No.: 11/700,142

(22) Filed: Jan. 31, 2007

(65) Prior Publication Data

US 2007/0141330 A1    Jun. 21, 2007

Related U.S. Application Data

(63) Continuation of application No. PCT/JP2005/014494, filed on Aug. 2, 2005.

(30) Foreign Application Priority Data

Aug. 3, 2004   (JP) .................................. 2004-226707

(51) Int. Cl.
*B32B 7/12* (2006.01)
*B32B 15/04* (2006.01)
(52) U.S. Cl. ..................... 428/343; 428/354; 428/355 R
(58) Field of Classification Search .................. 428/343, 428/354, 355 R
See application file for complete search history.

(56) References Cited

U.S. PATENT DOCUMENTS

| 4,999,242 | A | * | 3/1991 | Ishiwata et al. | ............... 428/345 |
| 5,149,586 | A | | 9/1992 | Ishiwata et al. | |
| 5,281,473 | A | | 1/1994 | Ishiwata et al. | |
| 5,304,418 | A | * | 4/1994 | Akada et al. | ............... 428/345 |
| 6,225,194 | B1 | | 5/2001 | Noguchi et al. | |
| 6,403,215 | B1 | | 6/2002 | Kondo et al. | |

FOREIGN PATENT DOCUMENTS

| CN | 1238367 A | 12/1999 |
| JP | 7-15087 B2 | 2/1995 |
| JP | 9-298173 A | 11/1997 |
| JP | 9-316656 A | 12/1997 |

(Continued)

OTHER PUBLICATIONS

Office Action issued on Apr. 16, 2009 in U.S. Appl. No. 11/417,123.

(Continued)

*Primary Examiner* — Victor Chang
(74) *Attorney, Agent, or Firm* — Birch, Stewart, Kolasch & Birch, LLP

(57) ABSTRACT

A wafer-processing tape, having a removable adhesive layer (2), and an adhesive layer (3), formed on a substrate film (1), wherein the tape is used in a process involving the steps of: grinding a back face of a wafer circuit substrate (5) having convex-type metal electrodes (4), and dicing the wafer circuit substrate into chips, in a state that the tape is adhered to the wafer circuit substrate; and picking up the chips, in which the chips are picked up in a state that the adhesive layer (3) is peeled from the substrate film (1) but is bonded to the individual chip.

10 Claims, 3 Drawing Sheets

FOREIGN PATENT DOCUMENTS

| | | | |
|---|---|---|---|
| JP | 10-335271 A | 12/1998 |
| JP | 2000-182995 A | 6/2000 |
| JP | 2001-44142 A | 2/2001 |
| JP | 2001-332520 A | 11/2001 |
| JP | 2002-118147 A | 4/2002 |
| JP | 2002-158276 A | 5/2002 |
| JP | 2002-226796 A | 8/2002 |
| JP | 2003-13011 A | 1/2003 |
| JP | 2003-64329 A | 3/2003 |
| JP | 2003-173994 A | 6/2003 |
| JP | 2003-206457 A | 7/2003 |
| JP | 2003-261838 A | 9/2003 |
| JP | 2004-043760 A | 2/2004 |
| JP | 2004-123963 A | 4/2004 |
| JP | 2004-186429 A | 7/2004 |
| JP | 2004-256793 A | 9/2004 |
| JP | 2005-48039 A | 2/2005 |
| JP | 2005-159069 A | 6/2005 |
| KR | 1998-064239 A | 10/1998 |

OTHER PUBLICATIONS

Office Action issued on Jul. 1, 2008 in U.S. Appl. No. 11/417,123.
Office Action issued on Jun. 21, 2010 in U.S. Appl. No. 11/417,123.
Office Action issued on Mar. 9, 2010 in U.S. Appl. No. 11/417,123.
Office Action issued on Oct. 22, 2009 in U.S. Appl. No. 11/417,123.
Office Action issued on Oct. 30, 2007 in U.S. Appl. No. 11/417,123.
Office Action issued on Sep. 17, 2007 in U.S. Appl. No. 11/417,123.
Japanese Office Action (with English translation) issued on Jun. 29, 2010 in corresponding Japanese patent application No. 2004-226707.
Japanese Office Action (Decision to Grant a Patent) with English translation dated Jun. 14, 2011, issued in corresponding Japanese patent application No. 2004-226707.

* cited by examiner

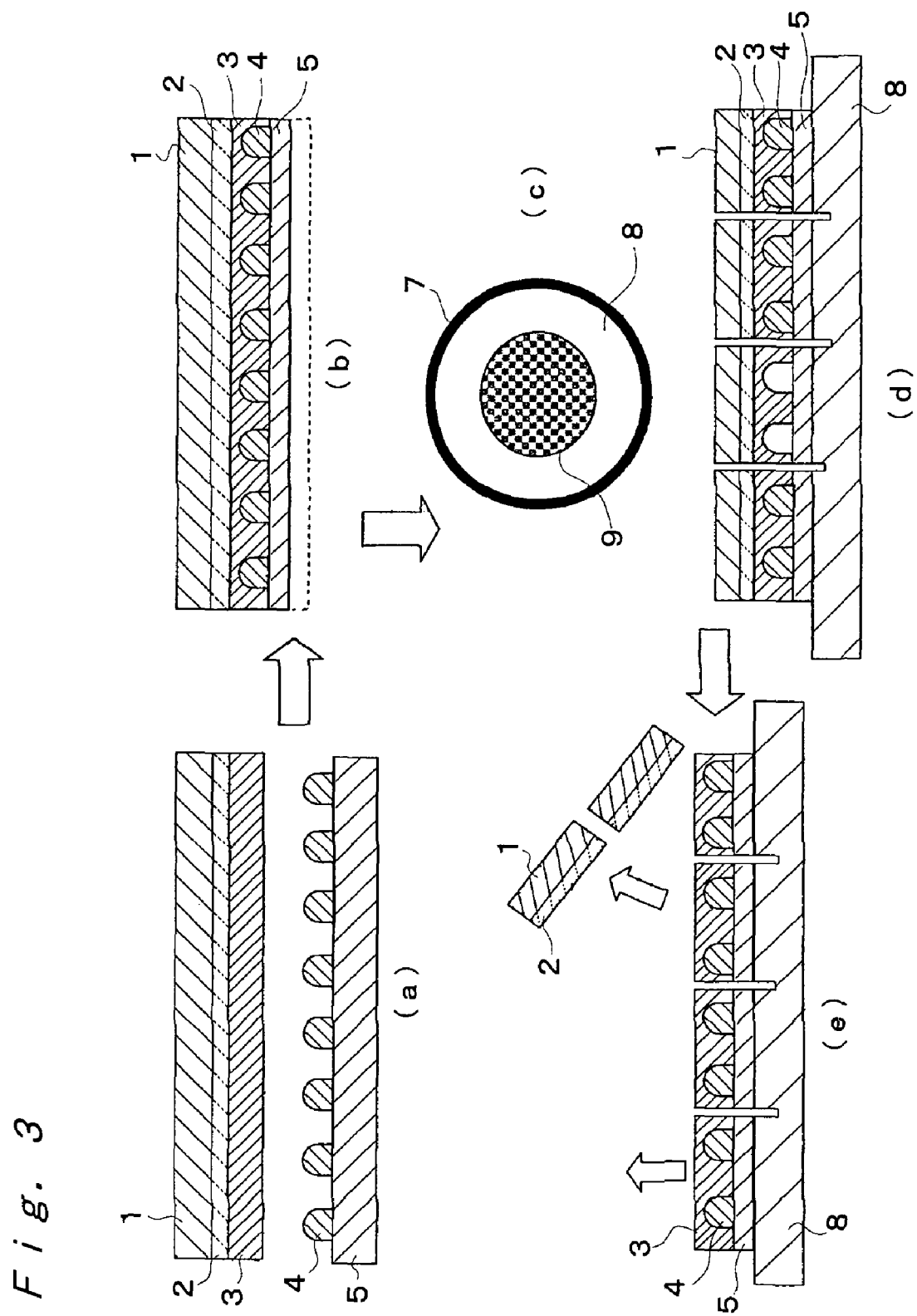

– 1 –

METHOD OF PRODUCING A SEMICONDUCTOR DEVICE, AND WAFER-PROCESSING TAPE

This application is a Continuation Application of PCT International Application No. PCT/JP2005/014494 filed on Aug. 2, 2005, which designated the United States, and on which priority is claimed under 35 U.S.C. §120, the entire contents of which are hereby incorporated by reference.

TECHNICAL FIELD

The present invention relates to a method of producing a semiconductor device, and it also relates to a wafer-processing tape that can be used in the same.

BACKGROUND ART

Along with the recent development of small-sized and thinner-type electronic machinery and tools (electronic devices), there has been strong demand for the establishment of higher-density packaging technique of semiconductor elements. The method using a lead frame, which method has been used for packaging a semiconductor device so far, fails to cope with the demand for such high-density packaging. Also, a method of primarily using a resin paste, among die bonding materials used for bonding these, is currently dominant.

For this, flip-chip packaging is proposed as a method to package a semiconductor device having the substantially same size as a semiconductor element. This flip-chip packaging has attracted remarkable attention as a method of packaging semiconductor elements in a minimum area, corresponding to the current development of small-sized and high-density electronic machinery and tools. A bump is formed on an aluminum electrode of a semiconductor element used for this flip-chip packaging, and the bump is bonded with wiring on a circuit substrate electrically. As to the composition of the bump, a solder is primarily used, and this solder bump is formed on an aluminum terminal that is exposed and connected to the internal wiring of a chip by deposition or plating. Other examples of the bump include a gold stud bump formed in a wire bonding device.

If a semiconductor device connected by such a flip-chip is used as it is, the electrode of the connected portion is exposed to the air, and large stress is applied to the connected portion of the bump through thermal history in the subsequent step of, for example, a solder reflow step, because of a large difference in the thermal expansion coefficient between a chip and a substrate, giving rise to a problem concerning packaging reliability.

To solve this problem, a method is adopted in which, after the bump is connected with the substrate, the gap between the semiconductor element and the substrate is filled with a resin paste or an adhesive film, which is then cured to fix and secure the semiconductor element to the substrate, to improve reliability of the connected portion.

Also, a tape is proposed as a removable adhesive or adhesion tape to be used from a dicing step to a die bonding step. However, it has been found that a removable adhesive or adhesion agent used for bonding after UV curing for this purpose has difficulty in retaining resin fluidity, due to the formation of a three-dimensional crosslinking structure associated with UV radiation. Therefore, the filler cannot satisfactorily be filled into the substrate irregular surface, rendering it impossible to obtain bonding reliability.

In the meantime, generally, semiconductor elements subjected to flip-chip packaging have many electrodes, and also these electrodes are arranged around the semiconductor element because of a circuit design problem. Therefore, if a liquid resin is poured from the gap between electrodes of these semiconductor elements by a capillary phenomenon when a resin paste is filled, the resin spreads insufficiently, which readily allows the presence of unfilled portions, posing problems, including such operational inferiority as that the action of the semiconductor element tends to be unstable, and low-reliability moisture resistance. Further, when the size of a chip is smaller, the substrate is contaminated by an overflowed liquid resin, and when the electrode pitch is narrowed, it makes for difficulty in pouring the resin. Also, it takes too much period of time to fill the resin in each flip-chip-connected semiconductor element, which can represent a productivity problem, considering the curing step. A method in which a wafer is diced into chips after an adhesive film is bonded by thermocompression at one time, is more simplified in steps than the method of filling a resin paste, and is hence advantageous. However, because a wafer is damaged more easily at the time of thermocompression bonding, as the thickness of the wafer is decreased, which increases the need to grind or cut the backing face of the thick wafer after the adhesive film is bonded by thermocompression.

However, in a conventional combination of back face grinding removable adhesive tape and an adhesive film, this tape has high affinity to the adhesive film, giving rise to the problem that peeling force after the backing face is ground tends to be increased, and therefore damage to the wafer is easily caused in a peeling step. Also, to improve the fill-ability of the adhesive film into irregular substrate, to thereby increase bonding reliability, it is necessary to lower melt viscosity when the adhesive film is applied under heating. However, the peeling force of the adhesive film from the removable adhesive tape tends to be increased by application and adhesion under heating, posing the problem that it is difficult to peel the adhesive film from the removable adhesive tape after adhesion under heating.

Other and further features and advantages of the invention will appear more fully from the following description, taken in connection with the accompanying drawings.

BRIEF DESCRIPTION OF DRAWINGS

FIG. 1(a) is a sectional view, FIG. 1(b) is a bottom view, FIG. 1(c) is a sectional view, FIG. 1(d) is a sectional view, and FIG. 1(e) is a sectional view.

FIG. 2(a) is a sectional view, FIG. 2(b) is a sectional view, FIG. 2(c) is a plane view, FIG. 2(d) is a sectional view, and FIG. 2(e) is a sectional view.

FIG. 3 is an explanatory view showing a process of a still another embodiment of the method of producing a semiconductor device, by using the wafer-processing tape, according to the present invention. FIG. 3(a) is a sectional view, FIG. 3(b) is a sectional view, FIG. 3(c) is a plane view, FIG. 3(d) is a sectional view, and FIG. 3(e) is a sectional view.

DISCLOSURE OF INVENTION

Figure 1:
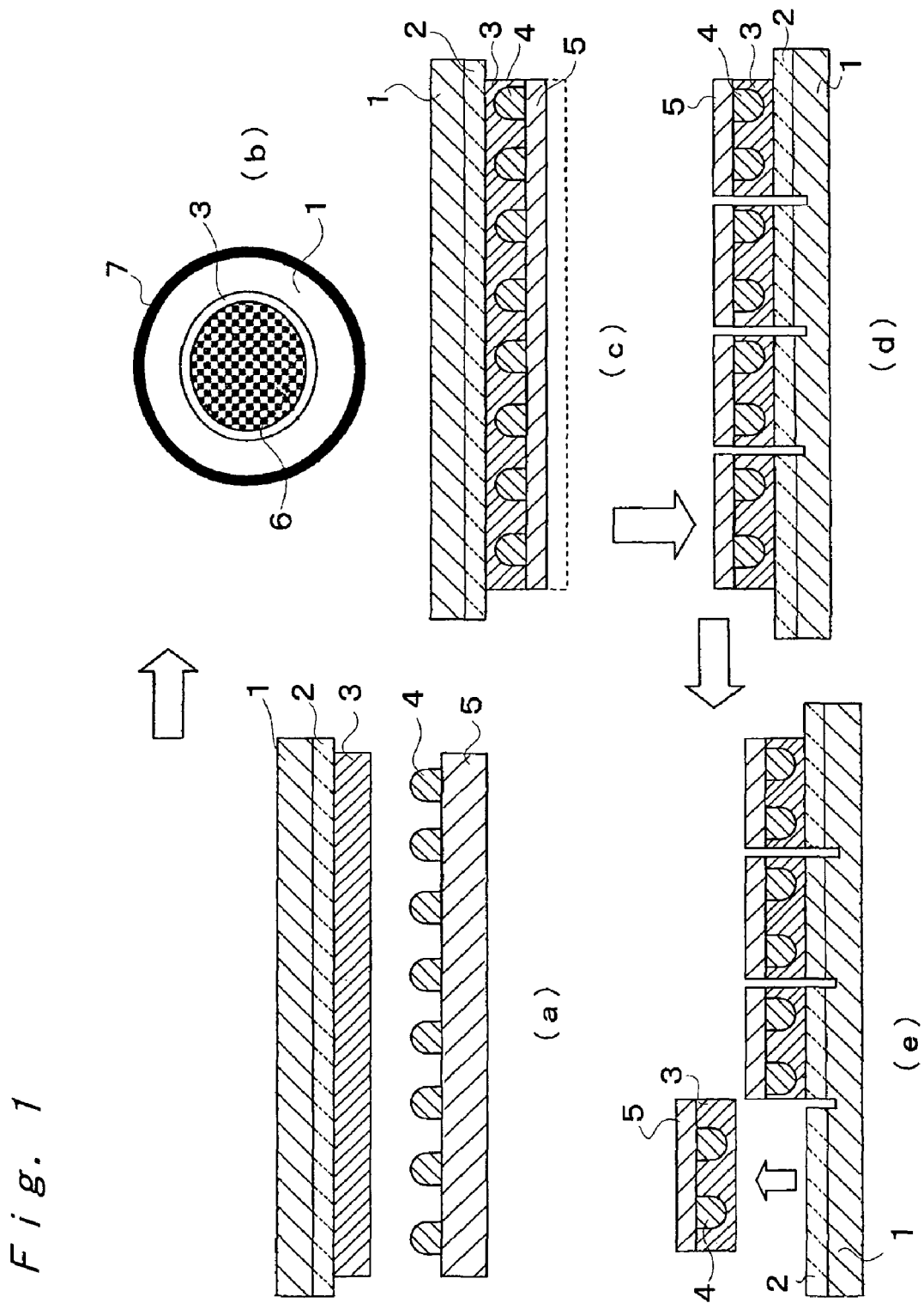
FIG. 1 is an explanatory view showing a process using the wafer-processing tape of an embodiment of the present invention.

According to the present invention, there is provided the following means:

(1) A wafer-processing tape, comprising a removable adhesive layer, and an adhesive layer, formed on a substrate film,
wherein said tape is used in a process involving the steps of: grinding a back face of a wafer circuit substrate having convex-type metal electrodes, and dicing the wafer circuit substrate into chips, in a state that said tape is adhered to the wafer circuit substrate; and picking up the chips, in which the chips are picked up in a state that the adhesive layer is peeled from the substrate film but is bonded to the individual chip;
(2) The wafer-processing tape according to the above (1), wherein in the picking up step, the chip is peeled from the removable adhesive layer, in a state that the removable adhesive layer is bonded with the substrate film and only the adhesive layer is bonded with the chip;
(3) The wafer-processing tape according to the above (2), wherein the removable adhesive layer contains an acryl type copolymer as its principal component and has a gel fraction of 60% or more;
(4) The wafer-processing tape according to any one of the above (1) to (3), wherein the removable adhesive layer is radiation-curable;
(5) The wafer-processing tape according to any one of the above (1) to (4), wherein the adhesive layer is heat-curable;
(6) The wafer-processing tape according to any one of the above (1) to (5), wherein the adhesive layer contains, as its component, at least any one of an acrylic rein, an epoxy resin or a polyimide resin, and has a storage elastic modulus at 25° C. of 1 MPa or more and a storage elastic modulus at 80° C. of 0.05 MPa or less;
(7) The wafer-processing tape according to any one of the above (1) to (6), wherein the removable adhesive layer contains an acryl type copolymer as its principal component, said acryl type copolymer being composed of, as its principal component, an acryl type copolymer having at least a radiation-curable carbon-carbon double bond-containing group, and a group containing a hydroxyl group and a carboxyl group on a primary chain;
(8) A method of producing a semiconductor device by using the wafer-processing tape according to the above (1), comprising the steps of:
adhering said tape to a wafer circuit substrate having convex-type metal electrodes;
grinding a back face of the wafer circuit substrate;
dicing the wafer circuit substrate into chips;
picking up the chips; and
flip-chip-bonding the picked-up chips onto a substrate;
(9) The method of producing a semiconductor device according to the above (8), further comprising: adhering a dicing removable adhesive tape, to the wafer-processing tape adhered to the wafer circuit substrate having convex-type metal electrodes, after the grinding step and before the dicing step; and
(10) The method of producing a semiconductor device according to the above (8), further comprising: adhering a dicing removable adhesive tape, to a back face of the wafer circuit substrate having convex-type metal electrodes to which the wafer-processing tape is adhered, after the grinding step and before the dicing step.

Herein, the term "removable adhesive agent" means an agent capable of adhering and being removed after treatment such as curing, while the term "adhesive agent" means an agent capable of adhering only. For example, the term "radiation-curable removable adhesive agent" means a removable adhesive agent capable of being removed or pealed off by hardening by irradiation of radiation such as UV, after application of the removable adhesive agent to a wafer and the like.

Further, the term "adhesive layer" means a layer, which can be peeled off from the removable adhesive layer and remain adhered to a chip when a semiconductor wafer or the like is mounted and diced and then the chip is picked up, and which can be used as an adhesive when the chip is mounted on and fixed to a substrate or a lead frame.

Further, the term "removable adhesive layer" means a layer that has a lower peeling force with the target to be bonded than that of the adhesive layer, and that can be used for temporary adhesion.

Further, the term "peeling force" means a force needed for peeling the adhered surfaces apart, and can be determined according to the method as stipulated in JIS Z0237.

The flip-chip packaging method for a wafer having metal electrodes, by using the wafer-processing tape, according to the present invention, exhibits a significant effect in formation of a thin wafer chip laminate structure, and it also exhibits such excellent effects that a thin wafer can be processed easily and safely and the entire process can be shortened.

Further, the wafer-processing tape of the present invention can be used throughout a process of a wafer back face-grinding step, a dicing step, and a die-bonding step; and it is preferably used in the above method of producing a flip-chip packaged substrate.

BEST MODE FOR CARRYING OUT THE INVENTION

The inventors of the present invention have made various studies to solve the problems in the above conventional flip-chip packaging process. As a result, we found that each diced wafer circuit substrate to which an adhesive film is attached can be flip-chip-bonded with a substrate easily and safely, and further a conventional production process can be shortened, by adhering a specific protective tape having a specific adhesive film layer onto the surface of an electrode before the back face of a wafer circuit substrate with convex metal electrodes is ground, by dicing the wafer circuit substrate into chips in the state that the protective tape is adhered, and by peeling only the protective tape when peeling the protective tape from the circuit substrate with electrodes, to allow the adhesive film to be left on the wafer circuit substrate with metal electrodes. Based on the above finding, we have attained the present invention.

The present invention will be described in detail below.

The wafer-processing tape of the present invention has a substrate film, and a removable adhesive layer and an adhesive layer formed on the substrate film. The removable adhesive layer is preferably one containing an acryl type copolymer as its principal component (preferably 80% by mass or more). As the acryl type copolymer to be used, is preferable an acryl type copolymer containing, as essential components, at least a radiation-curable carbon-carbon double bond, an epoxy group, and a carboxyl group at its side chain. No particular limitation is imposed on how to produce the acryl type copolymer, and use can be made, for example, of a compound obtained by reacting a compound (1), such as an acryl type copolymer or methacryl type copolymer, which has a photopolymerizable carbon-carbon double bond and a functional group, with a compound (2) having a functional group capable of reacting the above functional group.

Among these compounds, the above compound (1) having a photopolymerizable carbon-carbon double bond and a functional group may be obtained by copolymerizing a monomer ((1)-1), such as an alkyl acrylate or alkyl methacrylate, having a photopolymerizable carbon-carbon double bond, with a monomer ((1)-2) having a functional group. As the monomer ((1)-1), included are, for example, hexyl acrylate, n-octyl acrylate, isooctyl acrylate, 2-ethylhexyl acrylate, dodecyl acrylate, decyl acrylate, each having 6 to 12 carbon atoms, or monomers having 5 or less carbon atoms, such as pentyl acrylate, n-butyl acrylate, isobutyl acrylate, ethyl acrylate, and methyl acrylate, or methacrylates like these. In this case of the monomer ((1)-1), as the number of carbon atoms of monomers increases, the glass transition temperature becomes lower, thereby enabling production of those of a desired glass transition temperature. Further, besides the glass transition temperature, for the purpose of enhancing compatibility and various performances, a low molecular compound having a carbon-carbon double bond, such as vinyl acetate, styrene, and acrylonitrile, can be blended within the range of 5% by mass or less.

Examples of the functional group which the monomer ((1)-2) has, include a carboxyl group, a hydroxyl group, an amino group, a cyclic acid anhydride group, an epoxy group, and an isocyanato group. Specific examples of the monomer ((1)-2) include acrylic acid, methacrylic acid, cinnamic acid, itaconic acid, fumaric acid, phthalic acid, 2-hydroxyalkyl acrylates, 2-hydroxyalkyl methacrylates, glycol monoacrylates, glycol monomethacrylates, N-methylol acrylamide, N-methylol methacrylamide, allyl alcohol, N-alkylaminoethyl acrylates, N-alkylaminoethyl methacrylates, acrylamides, methacrylamides, maleic anhydride, itaconic anhydride, fumaric anhydride, phthalic anhydride, glycidyl acrylate, glycidyl methacrylate, allyl glycidyl ether, and polyisocyanate compounds in which isocyanato groups are partially urethanated with a monomer having a hydroxyl group or carboxyl group and a photopolymerizable carbon-carbon double bond. In the compound (2), as a functional group to be used, in a case that the functional group in the compound (1), i.e. the monomer ((1)-2) is a carboxyl group or a cyclic acid anhydride group, included are a hydroxyl group, an epoxy group, an isocyanato group, and the like; or in a case that the functional group in the compound (1) is a hydroxyl group, included are a cyclic acid anhydride group, an isocyanato group, and the like; in a case that the functional group in the compound (1) is an amino group, included are an epoxy group, an isocyanato group, and the like; or in a case that the functional group in the compound (1) is an epoxy group, included are a carboxyl group, a cyclic acid anhydride group, an amino group, and the like. Specific examples of the functional group in the compound (2) include the same ones as those exemplified as the specific examples in the monomer ((1)-2). A compound having the characteristics as to, for example, the acid value or hydroxyl value, as preferably defined in the present invention can be produced, by leaving an unreacted functional group(s) in the reaction between the compound (1) and the compound (2).

In the synthesis of the above acrylic-series copolymer, when carrying out copolymerization reaction by solution polymerization, a ketone-series, ester-series, alcohol-series, or aromatic-series solvent can be used as an organic solvent. Among these, a preferable solvent is a usual good solvent for an acrylic-series polymer, which solvent has a boiling point of 60 to 120° C. Examples of the preferable solvent include toluene, ethyl acetate, isopropyl alcohol, benzene methylcellosolve, ethylcellosolve, acetone, methyl ethyl ketone, and the like. As a polymerization initiator, use may be generally made of a radical generating agent of azobis-series, such as $\alpha,\alpha'$-azobisisobutyronitrile, and organic peroxide-series, such as benzoylperoxide. At this time, a catalyst, a polymerization inhibitor, and the like can be optionally added, if necessary. In this way, it is possible to obtain an acrylic-series copolymer with a desired molecular weight, by controlling a polymerization temperature and a polymerization time. As for the control of the molecular weight, it is preferred to use a mercaptan-series or carbon tetrachloride-series solvent. Additionally, this copolymerization is not limited to solution polymerization, but it may also be performed in other ways such as bulk polymerization, suspension polymerization, and the like.

As mentioned in the above, the acrylic-series copolymer can be obtained. In the present invention, the molecular weight of the acrylic-series copolymer is preferably about 300,000 to about 1,000,000. If the molecular weight is too small, the cohesive force by irradiation of a radiation becomes lesser, thus a misalignment of elements (chips) may occur easily upon dicing the wafer, and image recognition may be difficult. Further, to prevent this misalignment of elements as much as possible, it is preferable that the molecular weight is 400,000 or more. If the molecular weight is too large, there is a possibility of gelation upon synthesis and coating. Further, as for properties of the copolymer, since the glass transition temperature is low, the flowability of the removable adhesive after irradiation of a radiation is not sufficient in a case of irradiation of a radiation not in a pattern shape but entirely, even if the molecular weight is large. Thus, although there is no such problems to occur that an interval between elements is insufficient after stretching or that it is difficult to recognize an image upon picking up, the molecular weight is more preferably 900,000 or less. Herein, the molecular weight in the present invention means a mass average molecular weight in terms of polystyrene.

Further, in the present invention, an amount of a photo polymerizable carbon-carbon double bond to be introduced in the acrylic-series copolymer is preferably 0.5 to 2.0 meq/g (milliequivalents/gram), more preferably 0.8 to 1.5 meq/g. If the double bond amount is too small, the effect of reducing the temporary adhesive strength after irradiation of a radiation becomes smaller. If the double bond amount is too large, the flowability of the removable adhesive agent after irradiation of a radiation is insufficient, thereby to make insufficient intervals between the resultant elements after stretching and make it difficult for each element to recognize an image upon picking up, in some cases. In this case, further, the acrylic-series copolymer itself may be insufficient in stability and may be made difficult to produce per se.

Further, in the present invention, the gel fraction of the removable adhesive agent before the removable adhesive layer is cured, can be controlled by adjusting the average molecular weight of the acryl type copolymer and the amount of the hardening agent to be blended. The gel fraction is preferably 60% or more, more preferably 80 to 100%. If the gel fraction is too small, the removable adhesive component tends to be slightly moved on the bonded interface, thus making it difficult to obtain stability on the peeling force with the lapse of time. Further, it is preferable that the acrylic-series copolymer has an OH group so that a hydroxyl group value would be from 5 to 100, since the temporary adhesion strength after irradiation of a radiation is reduced, to thus further decrease the risk of picking-up mistakes. Further, it is preferable that the acrylic-series copolymer has a COOH group so that an acid value would be from 0.5 to 30, since the tape recovery (restoration) property is improved, to thus make it easy to cope with a tape housing-type mechanism for a used tape. In the meanwhile, if the hydroxyl group value of the acrylic-series copolymer is too low, the temporary adhesion strength after irradiation of a radiation is not sufficiently reduced, or if too high, the flowability of the removable adhesive after irradiation of a radiation is damaged. Further, if the acid value is too low, the tape recovery property is not sufficiently improved, or if too high, the flowability of the removable adhesive agent is damaged.

Further, in case of hardening (curing) the radiation-curable removable adhesive agent for use in the present invention by ultraviolet irradiation, as an additional component, if necessary, use can be made of a photopolymerization initiator, such as isopropyl benzoin ether, isobutyl benzoin ether, benzophenone, Michler's ketone, chlorothioxanthone, dodecyl thioxanthone, dimethyl thioxanthone, diethyl thioxanthone, benzyl dimethyl ketal, α-hydroxycyclohexyl phenyl ketone, 2-hydroxymethylphenylpropane, and the like. The amount of the photo polymerization initiator to be blended is preferably 0.01 to 5 mass parts, to 100 mass parts of the acrylic-series copolymer.

The thickness of the removable adhesive layer is preferably 5 to 50 μm.

The base film that can be used in the present invention may be a film of any material having a radiation transmission property. Examples of the film material include a homopolymer or copolymer of an α-olefin, e.g. polyethylene, polypropylene, an ethylene/propylene copolymer, polybutene, an ethylene/vinyl acetate copolymer, an ethylene/acrylate copolymer, or an ionomer; an engineering plastic, e.g. polyethylene terephthalate, a polycarbonate, or poly(methyl methacrylate); or a thermoplastic elastomer, e.g. polyurethane, a styrene/ethylene/butene or pentene-series copolymer. Alternately, the base film may be formed from a mixture of two or more kinds of materials selected from the above compound group; and the base film may be formed of a single layer, or double or higher layers of any material selected from the above compound group.

The thickness of the film to be used is preferably 50 to 200 μm. A material obtained by laminating the above removable adhesive layer on this substrate film is hereinafter referred to also as "a protective film (removable or temporary adhesion tape)".

In the die-bonding adhesive layer according to the present invention, use may be made of an adhesive agent, which is usually used for die bonding, for example, a filmy adhesive agent containing an epoxy resin as its principal component.

Also, a fine metal powder and/or any of other materials excellent in electro conductivity or heat conductivity may be added to the above adhesive film, for the purpose of imparting electroconductivity and/or heat conductivity.

Also, it is possible to add fine powders of for example, metal oxides or glass, to the adhesive film, for the purpose of improving thermal stability.

To secure bonding reliability, it is important that the above adhesive agent is soft enough when adhered, to fill up the irregular surface of the substrate with it without generating voids. However, when the backing face is ground, the adhesive agent must have an elastic modulus of about 0.1 MPa or more, which is not deformed. In order to prevent voids from being occurred on the irregular surface of the substrate, the elastic modulus of the adhesive agent when adhered is preferably 0.05 MPa or less; and it is preferably 1 MPa or more at which temporary adhesiveness disappears when the adhesive agent is peeled off in the state that it is left on the circuit substrate.

The thickness of die bonding adhesive layer is preferably 5 to 50 μm.

The adhesive layer for wafer die-bonding may be formed as a wafer die-bonding film, by providing it on a carrier film, e.g. a poly(ethylene terephthalate) film, by coating or the like. In this case, the carrier film is to be peeled off when used.

The wafer-processing tape can be produced, by laminating the thus-obtained protective tape and wafer die-bonding film in a usual manner such that the removable adhesive layer and the adhesive layer would be laminated. In a preferred embodiment of the wafer-processing tape, the adhesive layer is peeled from the removable adhesive layer in the state that the removable adhesive layer is bonded with the substrate film and that only the adhesive layer is bonded with a chip in the pickup step. When the wafer-processing tape is adhered under heating to a semiconductor wafer, can be retained a temporary adhesion strength sufficient to prevent the wafer with electrodes from being peeled from the protective tape when the backing face is ground and the wafer is diced; and the removable adhesive layer can be easily peeled from a chip with the adhesive layer, by radiation curing, when the chip is picked up.

The peeling force between the adhesive film and the protective tape upon dicing is preferably 0.5 to 10 N/25 mm, and the peeling force between the chip to which the adhesive film is attached and the protective tape after irradiation of radiation is preferably 0.5 to 0.05 N/25 mm.

The above removable adhesive layer is preferably radiation-curable. Further, the above adhesive layer is preferably heat-curable. Further, preferably, the above adhesive layer contains, as its component, at least any one of an acrylic rein, an epoxy resin, or a polyimide resin, and has a 25° C. storage elastic modulus of 1 MPa or more (generally 50 MPa or less), and a 80° C. storage elastic modulus of 0.05 MPa or less (generally 0.005 MPa or more). Further, the removable adhesive layer preferably contains an acryl type copolymer as its principal component, the acryl type copolymer containing, as its principal component, an acryl type copolymer at least having a radiation-curable carbon-carbon double bond-containing group, and a group containing a hydroxyl group and a carboxyl group, on a primary chain thereof.

The wafer-processing tape of the present invention is to be used in a step of grinding the backing face of a wafer circuit substrate with metal electrodes, and a step of dicing the wafer circuit substrate into chips, in the state that it is adhered to the wafer circuit substrate. Accordingly, the wafer-processing tape of the present invention has a function as a protective tape when a wafer is ground, and it is also provided with a die bonding adhesive layer to be used when bonding a chip.

The wafer-processing tape of the present invention can be used, for example, as shown in FIG. 1. FIG. 1 is an explanatory view showing a process in one embodiment of the method of producing a semiconductor device by using the wafer-processing tape of the present invention. Herein, in the descriptions of figures below, the same reference numeral is used for the same element, to omit the duplicate explanation.

In the wafer-processing tape, as shown in the sectional view of FIG. 1(a), an adhesive layer 3 is laminated on a protective tape (BG tape) provided with a removable adhesive layer 2 laminated on a substrate film 1.

As the adhesive layer 3, a non-conductive or insulation film (NCF) or an anisotropic conductive film (ACF) may be used.

Then, as shown in the sectional view of FIG. 1(c), the wafer-processing tape is adhered to a wafer circuit substrate 5 with convex-type metal (e.g. gold) electrodes (bumps) 4, followed by heating, to thereby bond the tape with the substrate in such a manner as to embed the convex type metal electrodes 4 in the adhesive layer 3. Then, the backing face is ground by the depth shown by the dotted line, to a specified thickness. FIG. 1(b) is a bottom view in the step of FIG. 1(c), in which 6 denotes a gold bump wafer and 7 denotes a ring frame. Then, the circuit substrate was irradiated with radiation in the state where the processing tape is adhered to the circuit substrate. After that, the wafer circuit substrate was diced (FIG. 1(d)), to pick up chips (FIG. 1(e)). At this time, the adhesive layer 3 of the wafer-processing tape is peeled from the removable adhesive layer 2 of the protective tape, it is picked up in the state that it is bonded to the chip, and it is used as an adhesive agent in the die bonding step, to produce a semiconductor device.

Figure 2:
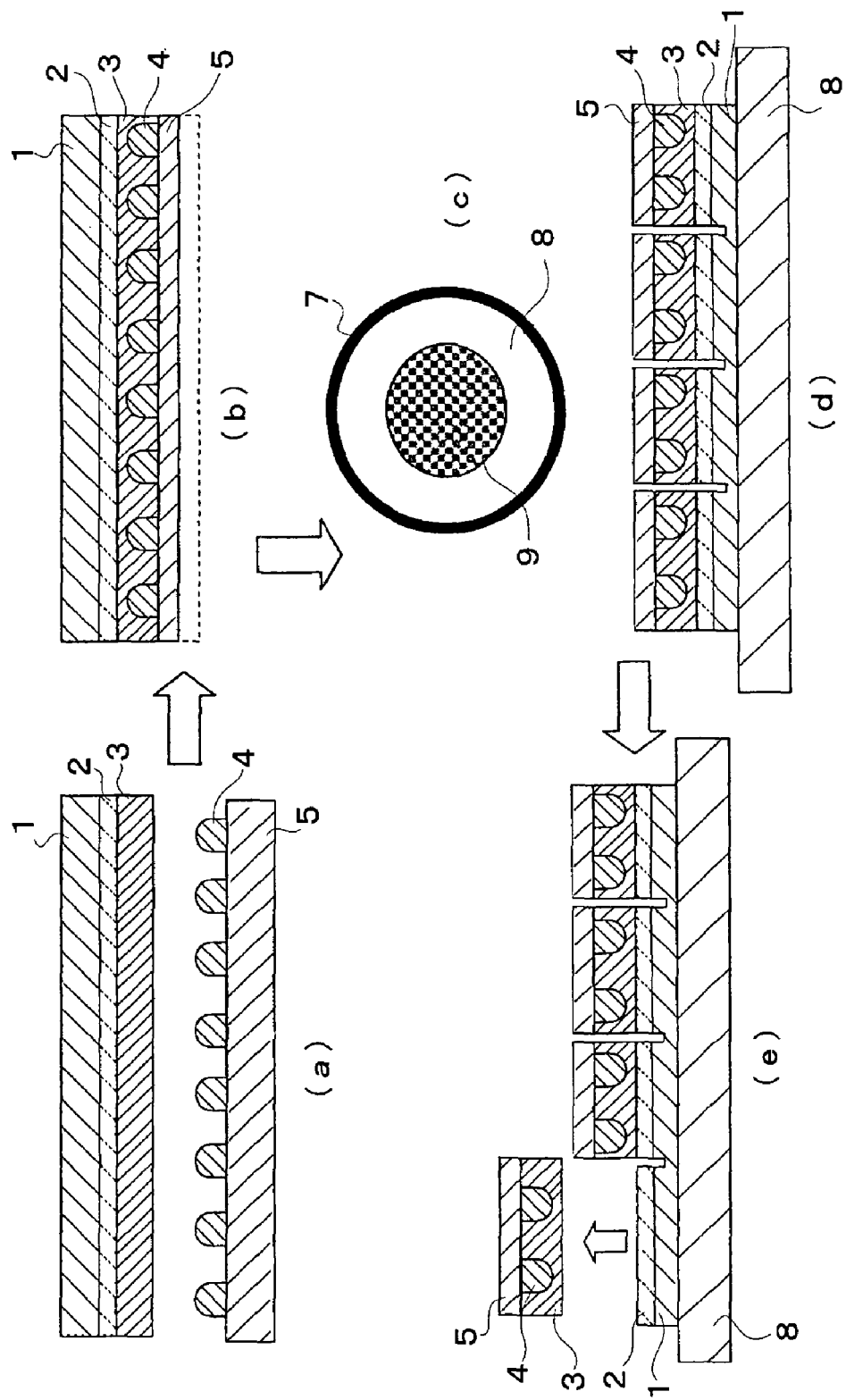
FIG. 2 is an explanatory view showing a process of another embodiment of the method of producing a semiconductor device, by using the wafer-processing tape, according to the present invention.

FIG. 2 is an explanatory view showing a process of another embodiment of the method of producing a semiconductor device by using the wafer-processing tape of the present invention. As shown in the sectional view of FIG. 2(*a*), the wafer-processing tape is comprised of an adhesive layer 3 that is laminated on a protective tape (BG tape) provided with a removable adhesive layer 2 laminated on a substrate film 1. Then, as shown in the sectional view of FIG. 2(*b*), the wafer-processing tape is adhered to a wafer circuit substrate 5 with convex type metal electrodes (bumps) 4, followed by heating, to thereby bond the tape with the substrate in such a manner as to embed the convex type metal electrodes 4 in the adhesive layer 3; and then, the backing face is ground by the depth shown by the dotted line, to a specified thickness. Then, a dicing removable adhesive tape 8 is adhered to the substrate film 1 side of the protective tape, followed by irradiation with radiation, and then the resultant wafer circuit substrate 5 is diced. FIG. 2(*c*) is a plan view in this step, in which 7 denotes a ring frame, and 9 denotes the gold bump wafer and the adhesive layer and the protective tape. Further, FIG. 2(*d*) is a sectional view in this step. Then, the chips are picked up (FIG. 2(*e*)). The adhesive layer 3 of the wafer-processing tape is peeled from the removable adhesive layer 2 of the protective tape, it is picked up in the state that it is bonded to the chip, and it is used as an adhesive agent in the die bonding step, to produce a semiconductor device.

FIG. 3 is an explanatory view showing a process in a still another embodiment of the method of producing a semiconductor device by using the wafer-processing tape of the present invention.

As shown in the sectional view of FIG. 3(*a*), the wafer-processing tape has the structure in which an adhesive layer 3 is laminated on a protective tape (BG tape) provided with a removable adhesive layer 2 laminated on a substrate film 1. Then, as shown in the sectional view of FIG. 3(*b*), the wafer-processing tape is adhered to a wafer circuit substrate 5 with convex type metal electrodes (bumps) 4, followed by heating, to thereby bond the tape with the substrate in such a manner as to embed the convex type metal electrodes 4 into the adhesive layer 3; and then, the backing face is ground by the depth shown by the dotted line, to a specified thickness. Then, a dicing removable adhesive tape 8 is adhered to the ground surface of the wafer, followed by irradiation with radiation, and the wafer circuit substrate 5 is diced from the protective tape side. FIG. 3(*c*) is a plan view in this step, in which 7 denotes a ring frame, and 9 denotes the gold bumped wafer and the adhesive layer and the protective tape. Further, FIG. 3(*d*) is a sectional view in this step. Then, by using a release (or peeling-off) tape, the protective tape having the substrate film 1 and the removable adhesive layer 2 is peeled off from the wafer, to pick up the chips to which the adhesive layer 3 is bonded (FIG. 3(*e*)). This adhesive layer 3 is used as an adhesive agent in the die bonding step, to produce a semiconductor device.

The present invention will be described in more detail based on examples given below, but the invention is not meant to be limited by these.

EXAMPLES

Each of the characteristics in the following examples were tested and evaluated, according to the following tests. The "part(s)" means a part(s) by mass.

1. Gel fraction: About 0.05 g of the removable adhesive layer was weighed, it was dipped in 50 ml of xylene for 24 hours at 120° C., and then the resultant xylene was filtered through a stainless-steel net of 200 meshes, and the resultant insoluble constituents remained on the net were dried for 120 minutes at 110° C. Then, the mass of the thus-dried insoluble constituents was weighed, to determine a gel fraction, according to the formula shown below:

Gel fraction (%)={(Mass of insoluble constituents)/(mass of weighed removable adhesive layer)}×100

2. Removable adhesive double bond amount: The amount of carbon-carbon double bond contained in about 10 g of the heated and dried removable adhesive agent was measured and quantitatively determined by a mass increasing method by bromine addition reaction in a dark place in vacuo.

3. Picking-up success rate: Any one of the processing tapes produced in Examples and Comparative Examples was adhered to a wafer having electrodes at ambient temperature or at 80° C. for 10 seconds; and the backing face of the wafer was ground to wafer thickness 50 μm. Then, the resultant wafer was diced into chips 10 mm×10 mm in size. Thereafter, ultraviolet rays were irradiated, if necessary, to the removable adhesive layer by an air-cooling-type high-pressure mercury lamp (80 W/cm, irradiation distance 10 cm) at intensity 200 mJ/cm$^2$. Then, a picking-up test was carried out, by using a die bonder tester (a three-stage thrust system, manufactured by Renesas Eastern Japan Semiconductor, Inc.), to find a picking-up success rate (%) per 100 picked-up chips in number.

4. Wafer back face-grinding property

○: Neither damage to a wafer nor occurrence of microcracks was observed.

x: Damage to a wafer or occurrence of microcracks was observed.

5. Dicing characteristics

○: The processing tape was peeled off during dicing.

x: The processing tape was not peeled off during dicing.

6. Reflow resistance reliability: In the evaluation of reflow resistance reliability of the flip-chip package produced in Examples or Comparative examples after the package was humidified;

○: No package crack was occurred even in the processing of JEDEC level 3.

x: Some package cracks were occurred in the processing of JEDEC level 3.

Method of Measuring Elastic Modulus

The elastic modulus of the adhesive film at 25° C. or 80° C. was measured in the following manner: A viscoelasticity meter (trade name: ARES, manufactured by Reometric Science Co.) was utilized to measure by starting from 0° C., and dynamic viscoelasticity was measured in the condition of temperature rising rate 5° C./min and frequency 1 Hz, in which the storage elastic modulus G' when the temperature reached 25° C. or 80° C. was defined as each elastic modulus.

Method of Measuring Peeling Force

Each peeling force before or after UV-irradiation (amount of UV-irradiation: 1,000 mJ/cm$^2$) was measured, according to JIS Z0237. The wafer-processing tape (wafer adhering or removable adhesive tape) was adhered under heating to the mirror surface of a silicon wafer heated to 80° C., to measure the peeling force between the adhesive layer and the removable adhesive tape. The test was carried out in the following conditions: 90° peeling; under peeling speed 50 mm/min.
Synthesis of Compound (A) an Acryl Type Copolymer 65 parts of butyl acrylate, 25 parts of 2-hydroxyethyl acrylate and 10 parts of acrylic acid were used as raw materials, to obtain a copolymer by solution radical polymerization. Then, 2-isocyanatoethyl methacrylate was added dropwise to this copolymer, to react the both to produce a copolymer. The amount of 2-isocyanatoethyl methacrylate to be added dropwise and the reaction time of the solution radical polymerization were controlled, to produce copolymers A1 to A6 and A11 to A13 differing in the quantity of carbon-carbon double bonds, the molecular weight, and the like.
Production of an Acryl Type Removable Adhesive Tape To the compound (A), were added and mixed a polyisocyanate compound (trade name: Coronate L, manufactured by Nippon Polyurethane Industry Co., Ltd.) as a compound (B) hardener, and α-hydroxycyclohexyl phenyl ketone as a compound (C) photoinitiator, in the formulation, as shown in Table 1 below, to obtain removable adhesive agents, respectively.

Any one of the removable adhesive agents was applied to a high-density polyethylene (PE) resin film (100 μm) in removable adhesive layer thickness 10 μm after drying, to produce removable adhesive tapes, respectively. The thus-obtained removable adhesive tape was laminated at ambient temperature on a 25 μm-thick adhesive film containing an epoxy resin as its principal component, which will be explained later, to produce a wafer-processing tape. The lamination was made in the following manner: The removable adhesive layer of the removable adhesive tape was laminated and adhered to the adhesive layer of the adhesive film, and then the below-described carrier film of the adhesive film was peeled off upon using the wafer-processing tape.
Production of Adhesive Film
(Production of Adhesive Film 1)

To a composition of 100 parts by mass of a cresol novolac-type epoxy resin (epoxy equivalent 197, molecular weight 1,200, and softening point 70° C.) as an epoxy resin, 1.5 parts by mass of γ-mercaptopropyltrimethoxysilane and 3 parts by mass of γ-ureidopropyltriethoxysilane as silane coupling agents, and 30 parts by mass of a silica filler of average particle diameter 16 nm, was added cyclohexanone, to mix these under stirring, followed by kneading using a beads mill for 90 minutes.

To the thus-kneaded mixture, were added 100 parts by mass of an acryl resin (mass average molecular weight 200,000, and glass transition temperature −17° C.), 5 parts of dipentaerythritol hexaacrylate as a hexafunctional acrylate monomer, 0.5 parts of an adduct of hexamethylenediisocyanate as a hardener, and 2.5 parts of Curesol 2PZ (trade name, manufactured by Shikoku Kasei (K.K.), 2-phenylimidazole), to mix these with stirring, followed by deaerating under vacuum, to obtain an adhesive agent.

The adhesive agent was applied to a 25 μm thick polyethylene terephthalate (PET) film which had been subjected to releasing treatment, followed by drying under heating at 110° C. for 1 minute, to form a coating film having a film thickness of 40 μm and put in a B-stage state, thereby to produce an adhesive film 1 provided with a carrier film.
(Production of Adhesive Film 2)

An adhesive film 2 was produced in the same manner as in the production of the adhesive film 1, except that the adduct of hexamethylenediisocyanate as a hardener was used in 0 part (i.e. not used), and that 2.5 parts of Curesol 2PHZ (trade name, manufactured by Shikoku Kasei (K.K.), 2-phenyl-4,5-dihydroxyimidazole) was used in place of Curesol 2PZ.
(Production of Adhesive Film 3)

An adhesive film 3 was produced in the same manner as in the production of the adhesive film 1, except that 50 parts by mass of a cresol novolac-type epoxy resin (epoxy equivalent 197, molecular weight 1,200, and softening point 70° C.) as an epoxy resin, and 1 part of an adduct of hexamethylenediisocyanate as the hardener, were used.

Examples 1 to 7

Any one of the wafer-processing tapes obtained by the combinations, as shown in Table 1, from which the carrier film had been peeled off, was, respectively, adhered to a 5-inch wafer with a gold stud bump under heating on a hot plate at 80° C., and then the backside of the circuit substrate was ground using a backside grinder, to make the circuit substrate have a finish thickness of 50 μm. Then, the circuit substrate was irradiated with UV at a dose of 1,000 mJ/cm² in the state that the processing tape was adhered to the circuit substrate, followed by dicing into chips each of which was 10 mm×10 mm square. The resultant chips were picked up by a pickup die bonder, and flip chips were packaged in accordance with the electrode position of the resin substrate, to produce a semiconductor device.

TABLE 1

| | | Example 1 | Example 2 | Example 3 | Example 4 | Example 5 | Example 6 | Example 7 |
|---|---|---|---|---|---|---|---|---|
| Support of protective tape | | PE | PE | PE | PE | PE | PE | PE |
| Protective tape removable adhesive agent composition | | 1A | 2A | 3A | 4A | 5A | 6A | — |
| Compound (A) | Double bond amount | 1 | 1 | 0.8 | 2 | 4 | 0 | — |
| | Molecular mass | 500,000 | 700,000 | 160,000 | 900,000 | 600,000 | 900,000 | — |
| | Hydroxyl group value | 40 | 35 | 56 | 23 | 0 | 120 | — |
| | Acid value | 10 | 6 | 6 | 5 | 6 | 0 | — |
| | Tg (° C.) | −60 | −65 | −20 | −64 | −30 | −53 | — |
| Compound (B) | Name | B1 | B1 | B1 | B1 | B1 | B1 | — |
| | Amount (mass part) | 1 | 1 | 2 | 2 | 2 | 3 | — |
| Compound (C) | | 1 | 1 | 1 | 1 | 1 | 1 | — |
| Gel fraction (%) | | 90.5 | 92 | 67 | 86 | 84 | 78 | — |
| Adhesive film | | 1 | 1 | 1 | 1 | 1 | 1 | 2 |
| Elastic modulus (25° C.) (MPa) | | 1 | 1 | 1 | 1 | 1 | 1 | 0.5 |
| Elastic modulus (80° C.) (MPa) | | 0.03 | 0.03 | 0.03 | 0.03 | 0.03 | 0.03 | 0.01 |
| Wafer back face grinding property | | ◯ | ◯ | ◯ | ◯ | ◯ | ◯ | ◯ |
| Dicing characteristics | | ◯ | ◯ | ◯ | ◯ | ◯ | ◯ | ◯ |
| Reflow resistance reliability | | ◯ | ◯ | ◯ | ◯ | ◯ | ◯ | ◯ |

TABLE 1-continued

|  |  | Example 1 | Example 2 | Example 3 | Example 4 | Example 5 | Example 6 | Example 7 |
|---|---|---|---|---|---|---|---|---|
| Peeling force between adhesive film/protective tape (N/25 mm) | Before UV irradiation | 1.3 | 1.6 | 1.7 | 1.3 | 1.7 | 0.35 | 0.45 |
|  | 80° C. heating → 1 h after UV-irradiation | 0.12 | 0.11 | 0.14 | 0.15 | 0.33 | 0.38 | 0.50 |
| Picking-up success rate (%) |  | 100 | 100 | 100 | 100 | 100 | 100 | 100 |

Comparative Examples 1 to 3

Semiconductor devices were produced in the same manner as in the examples, except for using any of wafer-processing tapes obtained by the combinations, as shown in Table 2; and the resultant devices were tested and evaluated in the same manner as above.

TABLE 2

|  |  | Comparative example | | |
|---|---|---|---|---|
|  |  | 1 | 2 | 3 |
| Support of protective tape |  | PE | PE | PE |
| Removable adhesive agent composition |  | 11A | 12A | 13A |
| Compound(A) | Double bond amount | 0.1 | 0.1 | A mixture was used in place of the compound (A) of Example 1. |
|  | Molecular mass | 500,000 | 5,000 |  |
|  | Hydroxyl group value | 0 | 35 |  |
|  | Acid value | 0 | 6 |  |
|  | Tg (° C.) | −60 | −65 |  |
| Compound (B) | Name | B1 | B1 | B1 |
|  | Amount (mass part) | 1 | 1 | 1 |
| Compound (C) |  | 1 | 1 | 1 |
| Gel fraction (%) |  | 20 | 78 | 0 |
| Adhesive film |  | 1 | 3 | 1 |
| Elastic modulus (25° C.) (MPa) |  | 1 | 0.9 | 1 |
| Elastic modulus (80° C.) (MPa) |  | 0.03 | 0.2 | 0.03 |
| Wafer back face grinding property |  | ○ | ○ | ○ |
| Reflow resistance reliability |  | ○ | X | ○ |
| Peeling force between removable adhesive layer/ adhesive layer (N/25 mm) | Before UV irradiation | 1.7 | 2.1 | 2.1 |
|  | 80° C. heating → 1 h after UV-irradiation | 2.5 | 0.2 | 20 or more, peeling was impossible |
| Picking-up success rate (%) |  | 0 | 100 | 0 |

B1: Coronate L
C: α-hydroxycyclohexyl phenyl ketone

As is apparent from the results shown in Tables 1 and 2, the comparative examples each had a conspicuously low picking-up success rate and were poor in reflow resistance evaluation. Contrary to the above, the examples according to the present invention each were excellent in all the characteristics evaluated.

INDUSTRIAL APPLICABILITY

The present invention is preferable as a production method involving a step of producing a semiconductor device by flip-chip packaging; in particular, from a step of grinding the back face of a wafer with metal electrodes to a dicing step and/or a die-bonding step.

Further, the wafer-processing tape of the present invention can be preferably used in the above method of producing a semiconductor device.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A wafer-processing tape, comprising a removable adhesive layer, and an adhesive layer, formed on a substrate film, wherein said tape is used in a process involving the steps of: grinding a back face of a wafer circuit substrate having convex-type metal electrodes, and dicing the wafer circuit substrate into chips, in a state that said tape is adhered to the wafer circuit substrate; and picking up the chips, in which the chips are picked up in a state that the adhesive layer is peeled from the substrate film but is bonded to the individual chip, wherein the removable adhesive layer is radiation-curable, contains an acryl type copolymer as its principal component and has a gel fraction of 60% or more before being cured by radiation, and wherein the adhesive layer contains at least one resin selected from the group consisting of an acrylic resin, an epoxy resin and a polyimide resin, and has a storage elastic modulus at 80° C. of 0.05 MPa or less.

2. The wafer-processing tape according to claim 1, wherein in the picking up step, the chip is peeled from the removable adhesive layer, in a state that the removable adhesive layer is bonded with the substrate film and only the adhesive layer is bonded with the chip.

3. The wafer-processing tape according to claim 1, wherein the adhesive layer is heat-curable.

4. The wafer-processing tape according to claim 1, wherein the adhesive layer has a storage elastic modulus at 25° C.' of 1 MPa or more.

5. The wafer-processing tape according to claim 1, wherein the acryl type copolymer comprises, as its principal component, an acryl type copolymer having at least a radiation-curable carbon-carbon double bond-containing group, and a group containing a hydroxyl group and a carboxyl group on a primary chain.

6. A method of producing a semiconductor device by using the wafer-processing tape according to claim 1, comprising the steps of:
    adhering said tape to a wafer circuit substrate having convex-type metal electrodes;
    grinding a hack face of the wafer circuit substrate;
    dicing the wafer circuit substrate into chips;
    picking up the chips; and
    flip-chip-bonding the picked-up chips onto a substrate.

7. The method of producing a semiconductor device according to claim 6, further comprising: adhering a dicing removable adhesive tape, to the wafer-processing tape adhered to the wafer circuit substrate having convex-type metal electrodes, after the grinding step and before the dicing step.

8. The method of producing a semiconductor device according to claim 6, further comprising: adhering a dicing removable adhesive tape, to a hack face of the wafer circuit substrate having convex-type metal electrodes to which the wafer-processing tape is adhered, after the grinding step and before the dicing step.

9. The wafer-processing tape according to claim 5, wherein the acryl type copolymer is a reaction product of a compound (A) comprising a photopolymerizable carbon-carbon double bond and a functional group, with a compound (B) having a functional group capable of causing a reaction with the functional group in compound (A).

10. A wafer-processing tape, comprising a removable adhesive layer, and an adhesive layer, formed on a substrate film,
    wherein the removable adhesive layer contains an acryl type copolymer as its principal component and has a gel fraction of 60% or more, and
    wherein the adhesive layer contains at least one resin selected from the group consisting of an acrylic resin, an epoxy resin and a polyimide resin, and has a storage elastic modulus at 80° C. of 0.05 MPa or less.

* * * * *